United States Patent
Coats

(10) Patent No.: US 7,440,577 B2
(45) Date of Patent: Oct. 21, 2008

(54) METHODS AND APPARATUS FOR AUTOMATIC MIXING OF AUDIO SIGNALS

(75) Inventor: Elon Ray Coats, Meridian, MS (US)

(73) Assignee: Peavey Electronics Corporation, Meridian, MS (US)

( * ) Notice: Subject to any disclaimer, the term of this patent is extended or adjusted under 35 U.S.C. 154(b) by 980 days.

(21) Appl. No.: 10/815,451

(22) Filed: Apr. 1, 2004

(65) Prior Publication Data

US 2005/0226444 A1    Oct. 13, 2005

(51) Int. Cl.
*H04B 1/00* (2006.01)
*H04B 1/20* (2006.01)
*H03G 3/00* (2006.01)
*H03G 7/00* (2006.01)
*G10H 1/08* (2006.01)

(52) U.S. Cl. .................. 381/119; 381/104; 381/107; 381/109; 381/106; 381/108; 369/4; 84/625; 84/660; 84/697

(58) Field of Classification Search .............. 381/119, 381/102–109, 111, 122, 92, 98; 84/625, 84/660, 697; 369/4
See application file for complete search history.

(56) References Cited

U.S. PATENT DOCUMENTS

| | | | | |
|---|---|---|---|---|
| 4,864,627 A | * | 9/1989 | Dugan | 381/108 |
| 6,501,717 B1 | * | 12/2002 | Yamazaki | 369/47.16 |
| 7,013,011 B1 | * | 3/2006 | Weeks et al. | 381/98 |
| 7,251,337 B2 | * | 7/2007 | Jacobs | 381/107 |
| 2004/0008851 A1 | * | 1/2004 | Hagiwara | 381/104 |

OTHER PUBLICATIONS

Tom Stuckman and Steve Marks; Automatic Mixers; catalog; 1999 Peavey Architectural Acoustics, Meridian, MS.

\* cited by examiner

*Primary Examiner*—Vivian Chin
*Assistant Examiner*—Devona E. Faulk
(74) *Attorney, Agent, or Firm*—Matthew B. Dernier; Kaplan Gilman Gibson & Dernier LLP

(57) ABSTRACT

Methods and apparatus for automatically mixing a plurality of audio channels by adjusting respective gains of the audio channels using a control signal based on an aggregate of input levels of respective audio signals of the audio channels; and reducing the gain of a given one of the audio channels when an input level of the audio signal of that audio channel exceeds a threshold, irrespective of whether the control signal would permit the gain to rise higher.

14 Claims, 2 Drawing Sheets

METHODS AND APPARATUS FOR AUTOMATIC MIXING OF AUDIO SIGNALS

BACKGROUND OF THE INVENTION

The present invention relates to automatic mixing of audio signals and, more particularly, to automatic mixing of audio signals in which a gain of one or more of the audio signals is reduced or compressed, irrespective of whether the automatic mixing function would permit the gain to be higher.

A typical sound system includes four basic elements, namely one or more microphones, a microphone preamplifier or mixer, a power amplifier and a loudspeaker system. When the sound system is introduced into an acoustic environment, acoustic feedback is a concern.

Acoustic feedback occurs when direct and reflected sound from the loudspeakers arrives at the microphone at a volume greater than the original sound that entered the microphone. Such feedback generally occurs at a prominent frequency, creating a howling sound. Acoustic feedback may also occur even when the direct and reflected sound arrives at the microphone at a slightly lower volume. Indeed, the sound may still ring through the system by reducing slightly in level each cycle.

The conventional approach to reducing acoustic feedback is to insure that the loudest sound from the loudspeaker system arrives at the microphone lower (e.g., a 6 dB margin) than the original sound. This suggests that the gain (of the audio channel) must be set so that the sound level from the user of the microphone (the talker) is 6 dB louder than the reverberant sound from the loudspeaker system.

If there is only one talker using the sound reinforcement system, then it is relatively easy to maintain the 6 dB margin and insure that acoustic feedback does not occur. As additional sound sources (talkers) and/or microphones are added, however, it becomes a more difficult and complex problem to maintain proper margins and insure that acoustic feedback does not occur.

As microphones are added to the system, the gain of each microphone has to be reduced, for example, by 3 dB each time the number of open microphones is doubled. This is undesirable, however, as the theoretical maximum sound amplification is likewise reduced. Controlling the gain of each microphone so that only one microphone is on (open) at one time would permit higher amplification in each audio channel.

An additional problem with employing multiple microphones is the comb filtering effect. This occurs when sound from the talker arrives (i) at the same microphone via two different paths of different length, and/or (ii) at two open microphones located at different distances from the talker. The comb filter effect emphasizes sound at some frequencies and cancels sound at other frequencies (resulting in a notched or combed frequency response).

The comb filter effect may be lessened by insuring that sound from the talker's voice impinging on microphones other than his own is about 10 dB lower. This can be achieved by ensuring that the talker's microphone is about three times closer to the talker than any other microphone. Alternatively, the gain of microphones other than the talker's may be reduced by 10 dB.

Automatic audio mixing technology (so-called automixers) may be used to address both acoustic feedback and the comb filter effect. An automixer automatically mixes signals from multiple-microphones, without the need for a system operator. An automixer activates only those microphones that are needed and adjusts the system gain to maintain system stability. This often results in a significantly increased system gain without acoustic feedback.

Automixers employ an algorithm to "decide" how to adjust the mix of the audio signals from the microphones. Several decision algorithms exist, such as the fixed threshold method, ambience sensing, direction sensing, the scanning threshold method, the number-of-microphones-equals-one (NOM=1) method, and gain sharing.

An example of the fixed threshold approach is manifest in the VOX (voice operated switch). A detector in the microphone channel of the mixer switches the channel ON when an audio signal is present, and switches the channel OFF when the audio signal is not present. To turn the channel ON, the audio signal must be greater than a preset threshold for that channel.

The adaptive threshold approach dictates that the automixer automatically adjust its threshold level to the conditions of the space in which the microphones are located. For example, in a noisy room the automixer would increase the threshold level to prevent any of the microphone channels from being triggered ON by noise. Ambience sensing, direction sensing, and the scanning threshold method are all species of the adaptive threshold approach.

The ambience sensing approach employs a "dummy microphone" to sense the ambient noise of the space and automatically adjust the threshold level accordingly. The direction sensing approach determines the direction from which the sound source arrives to the microphone. The automixer only responds to signals having sufficient levels within a predetermined space in front of the microphone. The Scanning threshold approach involves scanning the level on all of the input audio channels and activating the channel with the highest level. The highest level channel remains active while another scan begins. If the level of active channel is still higher than the other input channels, then it remains on and the process repeats.

Although the threshold approaches above are useful, the system gain still must be reduced unless only one microphone is permitted to be on at a given time. The NOM approach employs an attenuator circuit that "counts" the number of microphones that are on in the system, and then attenuates the system output by a predetermined amount. For example, when two microphones are on, the NOM circuit attenuates the output by 3 dB to maintain NOM=1 and to prevent acoustic feedback.

The gain sharing approach employs voltage-controlled amplifiers (VCAs) to vary the gain of each audio channel instead of using a switch. The gain of each channel is adjusted by comparing its level to the level of a sum of all channel levels. The gain is computed so that the combined system gain of all microphones remains constant. In this system, the microphones with the strongest signal are given the highest gain and those with low level signals have their gain reduced.

All of the above automixing systems are problematic in that they do not address a very unpredictable factor, namely, the potential that the talker may suddenly shout, which would tend to overdrive the channel and cause clipping, acoustic feedback or other undesirable characteristics in the output from the loudspeaker system. Indeed, the gain sharing automixing approach, for example, provides that the aggregate gain of the system is shared among the audio channels, with the highest level channel receiving most of the gain. When the talker suddenly shouts, the gain sharing automixing approach dictates that the channel should continue to receive most of the gain. This does nothing to counter the fact that the excessive sound level may overdrive the system.

In accordance with the foregoing, there is a need in the art for new methods and apparatus for automatic mixing of audio signals in which a gain of one or more of the audio signals is reduced, irrespective of the automatic mixing algorithm.

SUMMARY OF THE INVENTION

In accordance with one or more aspect of the present invention, an apparatus includes an automatic mixer circuit operable to produce a control signal usable to adjust respective gains of a plurality of audio channels based on an aggregate of input levels of respective audio signals of the audio channels; and a compression circuit operable to reduce the gain of a given one of the audio channels when an input level of the audio signal of that audio channel exceeds a threshold, irrespective of whether the control signal of the automatic mixer would permit the gain to rise higher.

In accordance with one or more further aspects of the present invention, an apparatus includes: an automatic mixer circuit operable to produce a control signal usable to adjust respective gains of a plurality of audio channels based on an aggregate of input levels of respective audio signals of the audio channels; a respective first summing circuit for each audio channel operable to produce a first error signal that is a difference of a signal indicative of the input level of the audio signal of the respective audio channel and the control signal from the automatic mixer circuit; a respective second summing circuit for each audio channel operable to produce a second error signal that is an aggregate of the signal indicative of the input level of the audio signal of the respective audio channel and a signal indicative of a threshold level for the respective audio channel; and a voltage controlled amplifier for each audio channel that is (i) responsive to the respective first error signal to reduce the gain of the respective audio channel when the control signal has a greater magnitude than the signal indicative of the input level of the respective audio signal, and (ii) responsive to the respective second error signal to reduce the gain of the respective audio channel when a magnitude of the signal indicative of the input level of the audio signal of the respective audio channel approaches and/or reaches a magnitude of the signal indicative of the threshold level for the respective audio channel, irrespective of whether the control signal of the automatic mixer would permit the gain to rise higher.

In accordance with one or more further aspects of the present invention, a method includes: automatically mixing a plurality of audio channels by adjusting respective gains of the audio channels using a control signal based on an aggregate of input levels of respective audio signals of the audio channels; and reducing the gain of a given one of the audio channels when an input level of the audio signal of that audio channel exceeds a threshold, irrespective of whether the control signal would permit the gain to rise higher.

In accordance with one or more further aspects of the present invention, a method includes: automatically mixing a plurality of audio channels by adjusting respective gains of the audio channels using a control signal based on an aggregate of input levels of respective audio signals of the audio channels; producing a first error signal in each of at least some of the audio channels that is a difference of a signal indicative of the input level of the audio signal of the respective audio channel and the control signal; producing a second error signal in each of the at least some audio channels that is an aggregate of the signal indicative of the input level of the audio signal of the respective audio channel and a signal indicative of a threshold level for the respective audio channel; automatically responding to the respective first error signal to reduce the gain of the respective audio channel when the control signal has a greater magnitude than the signal indicative of the input level of the respective audio signal: and automatically responding to the respective second error signal to reduce the gain of the respective audio channel when a magnitude of the signal indicative of the input level of the audio signal of the respective audio channel at least one of approaches and reaches a magnitude of the signal indicative of the threshold level for the respective audio channel, irrespective of whether the control signal of the automatic mixer would permit the gain to rise higher.

Other aspects, features, and advantages of the present invention will be apparent to one skilled in the art from the description herein taken in conjunction with the accompanying drawings.

DESCRIPTION OF THE DRAWINGS

For the purposes of illustration, there are shown in the drawings forms that are presently preferred, it being understood, however, that the invention is not limited to the precise arrangements and instrumentalities shown.

DETAILED DESCRIPTION OF THE PREFERRED EMBODIMENTS

Among the problems of the prior art that the present invention seeks to address is the inability of automixing technologies to address a sudden and abrupt increase in input level to a particular audio channel (e.g., shouting by the talker), which would tend to overdrive the channel and cause clipping, acoustic feedback or other undesirable characteristics in the output from the loudspeaker system. Some aspects of the present invention provide for reducing the gain of a particular audio channel when an input level of the audio channel exceeds a threshold, irrespective of whether control by an automatic mixer would dictate that the gain be higher.

Figure 1:
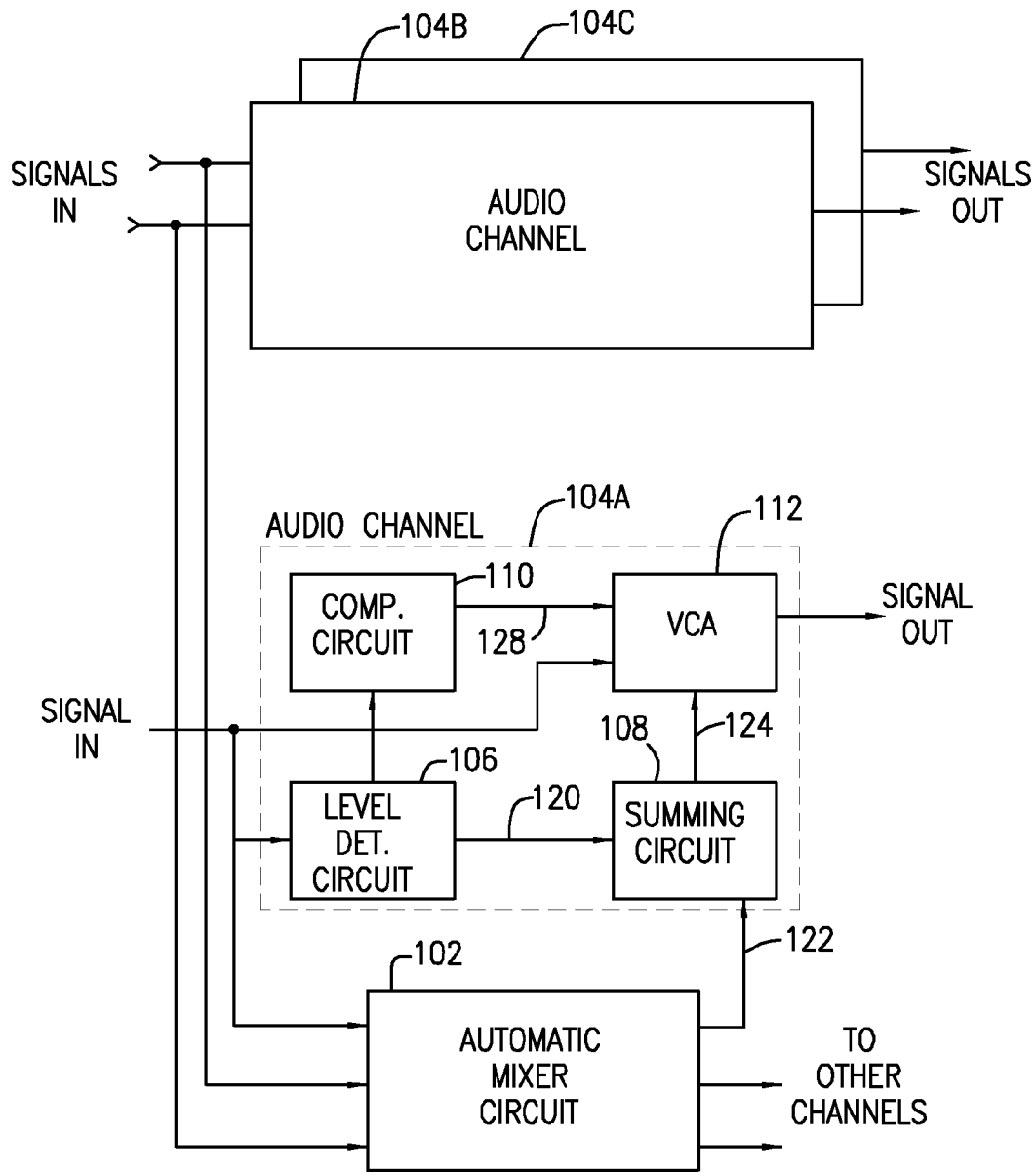
FIG. 1 is a block diagram of an automatic mixing circuit employing signal compression in accordance with one or more aspects of the present invention.

Referring now to the drawings, wherein like numerals indicate like elements, there is shown in FIG. 1 a block diagram of an automatic mixer and channel compression circuit 100 in accordance with one or more aspects of the present invention. The circuit 100 includes an automatic mixer 102, and a plurality of audio channel circuits 104. For the purposes of discussion, three audio channel circuits 104A-C are shown, where each audio channel circuit 104 is of substantially the same configuration as that shown in 104A. Each audio channel circuit 104 preferably includes a level detection circuit 106, a summing circuit 108, a compression circuit 110, and a voltage controlled amplifier (VCA) 112. Each of the audio channel circuits 104 preferably receives an audio signal labeled SIGNAL IN as an input, and conditions the signal in a manner that will be discussed in more detail hereinbelow to produce an output signal labeled SIGNAL OUT.

In general, the SIGNAL OUT audio signal of a given channel is a gain adjusted version of the SIGNAL IN audio signal. The VCA 112 provides such gain adjustment in response to signaling from at least one of the compression circuit 110 and the summing circuit 108. The summing circuit 108 receives a signal on line 120 that is indicative of the input level of the audio signal SIGNAL IN from the level detection circuit 106, and also receives a control signal on line 122 from the automatic mixer 102. The summing circuit 108 is preferably operable to aggregate the signals on lines 120 and 122 to produce an error signal on line 124, which is utilized to adjust the gain of the VCA 112. As will be discussed later in this description, it is preferred that the summing circuit 108 is operable to take a difference of the signal on line 120 and the control signal on line 122 in order to produce the error signal on line 124.

As introduced above, the signal on line 120 is indicative of the input level of the audio signal on line SIGNAL IN. The level detection circuit 106 is preferably operable to receive the audio signal SIGNAL IN and detect at least one of the envelope of the signal, the peek value of the signal, the RMS value of the signal, or any other measurement of the magnitude of the signal.

The automatic mixer 102 is preferably operable to produce the control signal on line 122 such that it is useable to adjust the gain of the audio channel circuit 104 (as well as any of the other audio channel circuits) based on an aggregate of input levels of audio signals of the respective audio channels of the system 100. In other words, the automatic mixer 102 is preferably operable to receive respective input signals from each of the audio channel circuits 104, aggregate such signals and produce the control signal on line 122 (as well as other control signals for the other audio channels).

The transfer function of the automatic mixer 102 preferably dictates that as the magnitudes of one or more of the input signals from the audio channels increase, the magnitude of each of the control signals output from the automatic mixer 102 also increases. It is preferred that the respective magnitudes of the control signals output from the automatic mixer 102 are representative of a sum of the respective magnitudes of the input signals to the respective audio channels. As will be discussed in more detail hereinbelow, the automatic mixer circuit 102, the summing circuit(s) 108 and the VCA(s) 112 preferably cooperate to achieve a gain sharing automixing approach. The preferred gain sharing approach operates such that each channel is adjusted based on a comparison of the given channel level to the level of a sum of all channel levels. It is most preferred that the gain is computed so that the combined system gain of all channels remains substantially constant. Thus, the channels with the strongest input signals are given the highest gains and those channels with low level input signals have lower gains. For example, each channel gain may be reduced by an amount (e.g. in dB) proportional to a difference between the given channel's level and a sum of all the channel levels.

As discussed above, each of the audio channel circuits 104 includes a level detection circuit 106 that produces a signal on line 120 indicative of the input level (or magnitude) of the audio signal on the respective SIGNAL IN line. Thus, the summing circuit 108 of each audio channel circuit 104 aggregates (i) a signal indicative of the input level of the audio signal of the given audio channel, and (ii) the control signal from the automatic mixer circuit 102. The summing circuit 108 is preferably implemented such that the error signal on line 124 represents a difference between the level of the input signal of a given audio channel and the aggregate level of the input signals of all of the audio channels. A further discussion of how the magnitude of the error signal on line 124 adjusts the gain by the VCA 112 will be presented later in this description.

The compression circuit 110 monitors the level of the input signal on line SIGNAL IN in order to further control the gain of the VCA 112. Although the compression circuit 110 could be designed to receive the input signal from SIGNAL IN directly, it is preferred that the compression circuit 110 receives the signal on line 120, which is indicative of the input level of the audio signal on the SIGNAL IN line. The compression circuit 110 also receives a threshold signal on line 126. The compression circuit 110 is preferably operable to produce an error signal on line 128 based on an aggregate (e.g., a summation, a difference, or a comparison) of the input signal level from line 120 and the threshold signal on line 126. For example, the compression circuit 110 may compare these two signals to produce a rapid change in the value of the error signal on line 128 and corresponding change in the gain of the VCA 112. As such a rapid change may not be most pleasing to a listener, it is preferred that the compression circuit 110 produces an error signal on line 128 that is an aggregate of the level of the input signal from line 120 and the threshold signal on line 126. It is most preferred that the error signal on line 128 remains substantially unchanged while the level of the signal on line 120 (e.g., the SIGNAL IN level) is significantly different from the level of the threshold signal on line 126. Under these conditions, the error signal on line 128 does not substantially affect the gain of the VCA 112. When the level of the input signal on line 120 approaches the threshold signal, however, it is preferred that the magnitude of the error signal on line 128 changes and causes the gain of the VCA 112 to reduce, irrespective of whether the control signal on line 124 would permit the gain of the VCA 112 to rise higher. In this sense, it is preferred that the compression circuit 110 has priority in setting the gain of the VCA 112, or at least has priority over the resultant gain as compared to the automatic mixer 102.

The operation of the automatic mixer and channel compression circuit 100 will now be discussed further in connection with several examples. In a first example, it is assumed that the circuit 100 includes two audio channels, where each channel includes an audio channel circuit 104 and each such circuit receives a control signal from the automatic mixer 102. It is further assumed that only one channel is active. Thus, in the active channel, the magnitude of the signal on line 120 and the magnitude of the control signal on line 122 will be substantially the same. Thus, the difference of these magnitudes as reflected in the error signal on line 124 will be approximately 0. Assuming that the level of the input signal in the active channel is not significantly near the level of the threshold signal on line 126, then the gain of the VCA 112 will be substantially controlled by the error signal on line 124 (as opposed to the error signal on line 128). Under these circumstances, the error signal on line 124 of the active channel preferably commands a maximum gain of the VCA 112 as compared with the gain of the VCA 112 of the inactive channel. Indeed, in the inactive channel, the level of the input signal on line 120 is 0, while the level of the control signal on line 122 is substantially the same level as the input signal of the active channel. Thus, the level of the error signal on line 124 in the inactive channel is relatively high in a direction that substantially reduces the gain of the VCA 112 in that channel.

In a second example, it is assumed that both channels are active and that the levels of the respective input signals are substantially the same. Thus, the magnitude of the signals on line 120 in each channel is approximately ½ the level of the control signal on line 122, which is an aggregate (e.g., a sum) of both such levels. Thus, the magnitude of the error signal on line 124 in each channel will cause the gain of the respective VCAs 112 in each channel to be roughly ½ of the maximum.

In a third example, it is assumed that both channels are active, where one channel has an input signal level that is twice that of the other active channel. Under these circumstances, the error signal on line 124 in the active channel having the higher input signal level will command the VCA 112 in that channel to be ⅔ of the maximum gain, and the error signal on line 124 in the active channel having the lower input signal level will be such that the VCA 112 in that channel achieves a gain that is ⅓ of the maximum level.

In each of the above examples, it was assumed that the respective input signal level in each active channel was not significantly near the respective threshold signal in each channel. However, if any of the input signals were to increase significantly towards the level of the threshold signal on line 126, then the error signal on line 128 of the particular channel would adjust the gain of the VCA 112 in that channel downward, despite that the automatic mixer 102 would tend to want to keep the gain of the VCA 112 at a higher level. Indeed, the tendency of the automatic mixer 102 is to cause the VCA 112 in a particular channel to increase its gain in response to a higher input level on the SIGNAL IN line. Recall that the compression circuit 110 produces an error signal on line 128 based on an aggregation of the level of the input signal from line 120 and the threshold signal on line 126. When the level of the input signal on line 120 approaches the threshold signal on line 126, the magnitude of the error signal on line 128 changes and causes the gain of the VCA 112 to reduce, irrespective of whether the control signal on line 124 would permit the gain of the VCA 112 to rise higher.

Figure 2:
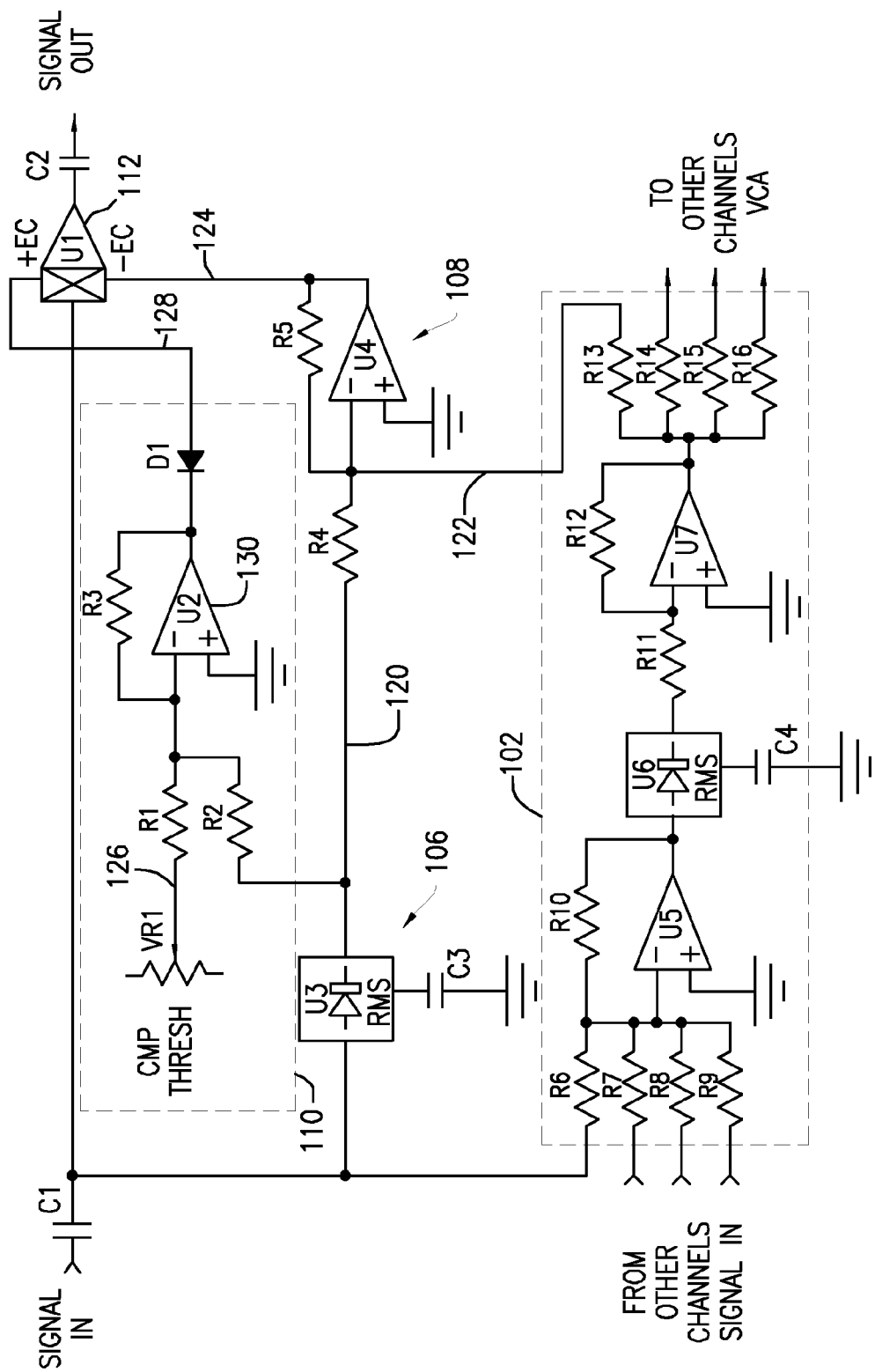
FIG. 2 is a detailed schematic that is suitable for implementing the automatic mixing circuit of FIG. 1.

Reference is now made to FIG. 2, which is a circuit schematic illustrating a detailed design that is suitable for implementing the automatic mixer and channel compression circuit 100 of FIG. 1. It is noted that the circuit diagram of FIG. 2 illustrates the automatic mixer 102 and only a single audio channel circuit 104, it being understood that multiple audio channel circuits 104 may be employed by repeated the circuitry shown. The audio channel circuit 104 includes an input coupling capacitor Cl that couples the input signal on line SIGNAL IN to the automatic mixer 102, the level detection circuit 106, and the VCA 112. The level detection circuit 106 includes an RMS circuit U3 employing a storage capacitor C3 to produce a signal indicative of the level of the input signal on line 120. The summing circuit 108 is implemented utilizing an operational amplifier U4 arranged in an inverting amplifier configuration using resistors R4 and R5.

The automatic mixer circuit 102 is implemented utilizing an operational amplifier U5 connected in an inverting summing configuration using resistors R6, R7, R8, R9, and R10. The output of the summing amplifier U5 is input into an RMS circuit U6 employing a storage capacitor C4. The output from the RMS circuit U6 is input into an inverting amplifier formed by operational amplifier U7 and resistors R11 and R12. The output of operational amplifier U7 is the source of the control signal for each of the audio channels in the system. This signal is isolated in each channel by way of resistors R13, R14, R15, and R16.

The respective gains of the operational amplifiers and the RMS circuits are preferably designed such that the level of the error signal on line 124 establishes a maximum gain of the VCA 112 in an active channel in which none of the other channels in the system are active. In the illustrated implementation, the error signal on line 124 establishes a maximum gain of the VCA 112 when it is at approximately 0 volts. Indeed, assuming a multi-channel system in which only one channel is active, the magnitude of the signal on line 120 representing the input signal level will substantially match the level of the control signal on line 122, which is an aggregate of all input signal levels of the system. Since only one channel is active, the RMS circuit U3 and the RMS circuit U6 will output signals of substantially the same magnitude. As the signal from RMS circuit U6 is inverted by operational amplifier U7, the error signal on line 124 in the active channel will be 0, thereby establishing a maximum gain for the VCA 112 in that channel. As other channels become active, and the RMS level produced by the RMS circuit U6 increases, the magnitude of the error signal on line 124 will increase (in a positive direction given the polarities of the specific implementation), which reduces the gain of the VCA 112 of what used to be the only active channel.

The compression circuit 110 in each channel includes an operational amplifier U2 in an inverting summing configuration by way of resistors R1, R2, and R3. The output of the operational amplifier U2 is coupled to the VCA 112 by way of diode D1. The threshold signal on line 126 is preferably established by way of potentiometer VR1. The impedances and bias voltages of the compression circuit 110 are preferably established such that the output of the operational amplifier U2 is generally positive (and the diode D1 reversed biased) when the magnitude of the signal produced by the RMS circuit U3 (e.g., the level of the input signal) is substantially different from the magnitude of the threshold signal on line 126. When the magnitude of the RMS signal produced by the RMS circuit U3 approaches and reaches the magnitude of the threshold signal on line 126, the operational amplifier U3 outputs a negative going voltage that forward biases the diode D1 and pulls down the voltage on the input to the VCA 112, thereby reducing the gain of the VCA 112. Notably, this reduction in the gain of the VCA 112 occurs irrespective the gain commanded by the error signal on line 124.

It is noted that the boundaries of the functional blocks depicted in FIGS. 1 and 2 have been selected for the purposes of discussion herein, but should not be considered in a way that would limit the invention. Indeed, the automatic mixer 102 may also be considered to include the respective summing circuits 108 of each of the audio channels. Likewise, the automatic mixer 102 may be considered to include the respective level detection circuits 106 of the audio channels. Still further, the automatic mixer circuit 102 may be considered to include the respective VCA circuits 112 of the audio channels. The functional boundaries merely provide a framework in which to discuss the invention.

It is noted that the automatic mixer and channel compression circuit 100 may be implemented utilizing analog circuitry, such as that illustrated in FIG. 2, or digital circuitry as will be apparent to those skilled in the art. Indeed, the methods and apparatus for automatic mixing described herein may be achieved utilizing any of the known technologies, such as standard digital circuitry, analog circuitry, any of the known processors that are operable to execute software and/or firmware programs, programmable digital devices or systems, programmable array logic devices, or any combination of the above.

Advantageously, the methods and apparatus of the present invention address the inability of prior art automixing technologies to address a sudden and abrupt increase in input level to a particular audio channel (e.g., shouting by the talker), which would tend to overdrive the channel and cause clipping, acoustic feedback or other undesirable characteristics in the output from the loudspeaker system.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus, comprising:
an automatic mixer circuit that produces a control signal usable to adjust respective gains of a plurality of audio channels based on an aggregate of input levels of respective audio
signals of the audio channnels; a compression circuit that reduces the gain of a given one of the audio channels when an input level of the audio signal of that audio channel exceeds a threshold, irrespective of whether the control signal of the automatic mixer would permit the gain to rise higher; and one of:
(i) a summing circuit that produces an error signal that is a difference of a signal indicative of the input level of the audio signal of the given audio channel and the control signal from the automatic mixer circuit; and a voltage controlled amplifier responsive to the error signal to reduce the gain of the given audio channel when the control signal has a greater magnitude than the signal indicative of the input level of the audio signal; or
(ii) a summing circuit that produces an error voltage that is an aggregate of a signal indicative of the input level of the audio signal of the given audio channel and a signal indicative of the threshold; and a voltage controlled amplifier responsive to the error signal to reduce the gain of the given audio channel when a magnitude of the signal indicative of the input level of the audio signal at least one of approaches and reaches a magnitude of the signal indicative of the threshold.

2. The apparatus of claim 1, further comprising a plurality of compression circuits, each compression circuit reducing the respective gain of a respective one of the audio channels when an input level of the respective audio signal of the respective audio channel exceeds a respective threshold, irrespective of whether the control signal of the automatic mixer would permit the respective gain to rise higher.

3. The apparatus of claim 1, wherein at least one of: the threshold is variable, and a user may adjust the threshold.

4. The apparatus of claim 1, further comprising at least one such summing circuit and at least one such voltage controlled amplifier in each of at least some of the audio channels, wherein each voltage controlled amplifier is responsive to a respective error signal to reduce a gain of the respective audio channel when the control signal has a greater magnitude than the signal indicative of the input level of the respective audio signal.

5. The apparatus of claim 1, further comprising at least one such summing circuit and at least one such voltage controlled amplifier in each of at least some of the audio channels, wherein each voltage controlled amplifier is responsive to a respective error signal to reduce a gain of the respective audio channel when a magnitude of the signal indicative of the input level of the respective audio signal at least one of approaches and reaches a magnitude of the signal indicative of the respective threshold.

6. The apparatus of claim 1, wherein the automatic mixer produces the control signal such that it is usable to adjust each of the gains of the plurality of audio channels in proportion to a ratio of the input level of the audio signal of the given audio channel to the aggregate input level of the respective audio signals of the audio channels.

7. An apparatus, comprising: an automatic mixer circuit that produces a control signal usable to adjust respective gains of a plurality of audio channels based on an aggregate of input levels of respective audio signals of the audio channels;
a respective first summing circuit for each audio channel that produces a first error signal that is a difference of a signal indicative of the input level of the audio signal of the respective audio channel and the control signal from the automatic mixer circuit;
a respective second summing circuit for each audio channel that produces a second error signal that is an aggregate of the signal indicative of the input level of the audio signal of the respective audio channel and a signal indicative of a threshold level for the respective audio channel; and
a voltage controlled amplifier for each audio channel that is (i) responsive to the respective first error signal to reduce the gain of the respective audio channel when the control signal has a greater magnitude than the signal indicative of the input level of the respective audio signal, and (ii) responsive to the respective second error signal to reduce the gain of the respective audio channel when a magnitude of the signal indicative of the input level of the audio signal of the respective audio channel at least one of approaches and reaches a magnitude of the signal indicative of the threshold level for the respective audio channel, irrespective of whether the control signal of the automatic mixer would permit the gain to rise higher.

8. A method, comprising:
automatically mixing a plurality of audio channels by adjusting respective gains of the audio channels using a control signal based on an aggregate of input levels of respective audio signals of the audio channels; and one of:
(i) producing an error signal that is a difference of a signal indicative of the input level of the audio signal of the given audio channel and the control signal; and automatically responding to the error signal to reduce the gain of the given audio channel when the control signal has a greater magnitude than the signal indicative of the input level of the audio signal; or
(ii) producing an error voltage that is an aggregate of a signal indicative of the input level of the audio signal of the given audio channel and a signal indicative of the threshold; and automatically responding to the error signal to reduce the gain of the given audio channel when a magnitude of the signal indicative of the input level of the audio signal at least one of approaches and reaches a magnitude of the signal indicative of the threshold.

9. The method of claim 8, further comprising reducing the gain in each of at least some of the audio channels when an input level of the audio signal of the respective audio channels exceeds a respective threshold thereof, irrespective of whether the control signal would permit the gain to rise higher.

10. The method of claim 8, further comprising varying the threshold.

11. The method of claim 8, further comprising:
producing an error signal in each of at least some of the audio channels that is a difference of a signal indicative of the input level of the audio signal of the respective audio channel and the control signal; and
automatically responding to the error signal in each of the at least some audio channels to reduce the gain of the respective audio channel when the control signal has a greater magnitude than the signal indicative of the input level of the respective audio signal.

12. The method of claim 8, further comprising:
producing an error signal in each audio channel that is an aggregate of a signal indicative of the input level of the audio signal of the respective audio channel and a signal indicative of the respective threshold thereof; and automatically responding to the error signal in each audio channel to reduce the gain of the respective audio channel when a magnitude of the signal indicative of the input level of the respective audio signal at least one of approaches and reaches a magnitude of the signal indicative of the respective threshold.

13. The method of claim 8, wherein the control signal is usable to adjust each of the gains of the plurality of audio channels in proportion to a ratio of the input level of the audio signal of the given audio channel to the aggregate input level of the respective audio signals of the audio channels.

14. A method, comprising:

automatically mixing a plurality of audio channels by adjusting respective gains of the audio channels using a control signal based on an aggregate of input levels of respective audio signals of the audio channels;

producing a first error signal in each of at least some of the audio channels that is a difference of a signal indicative of the input level of the audio signal of the respective audio channel and the control signal;

producing a second error signal in each of the at least some audio channels that is an aggregate of the signal indicative of the input level of the audio signal of the respective audio channel and a signal indicative of a threshold level for the respective audio channel;

automatically responding to the respective first error signal to reduce the gain of the respective audio channel when the control signal has a greater magnitude than the signal indicative of the input level of the respective audio signal; and automatically responding to the respective second error signal to reduce the gain of the respective audio channel when a magnitude of the signal indicative of the input level of the audio signal of the respective audio channel at least one of approaches and reaches a magnitude of the signal indicative of the threshold level for the respective audio channel, irrespective of whether the control signal of the automatic mixer would permit the gain to rise higher.

* * * * *